(12) United States Patent
Lin et al.

(10) Patent No.: US 8,919,423 B2
(45) Date of Patent: Dec. 30, 2014

(54) HEAT DISSIPATING DEVICE (75) Inventors: Chia-Yu Lin, New Taipei (TW); Yen Tsai, New Taipei (TW)

(73) Assignee: Cooler Master Development Corporation, New Taipei (TW)

( * ) Notice: Subject to any disclaimer, the term of this patent is extended or adjusted under 35 U.S.C. 154(b) by 332 days.

(21) Appl. No.: 13/472,509

(22) Filed: May 16, 2012

(65) Prior Publication Data
US 2013/0255927 A1    Oct. 3, 2013

(30) Foreign Application Priority Data

Mar. 30, 2012  (TW) .............................. 101205834 A (51) Int. Cl.
*F28F 7/00*   (2006.01)
*B21D 53/02*  (2006.01)

(52) U.S. Cl.
USPC ....... 165/80.1; 165/185; 165/80.3; 29/890.03

(58) Field of Classification Search
CPC ................................................. B23P 2700/10
USPC ..................... 165/80.1, 80.3, 185; 29/890.03, 29/890.039; 361/707, 710; 403/267, 268, 403/269; 164/10, 112, 332, 333, 334
See application file for complete search history.

(56) References Cited

U.S. PATENT DOCUMENTS 7,468,889 B2 * 12/2008  Su .................................. 361/719
2005/0000682 A1 *  1/2005  Chien et al. .................. 165/80.3

* cited by examiner

*Primary Examiner* — Allen Flanigan
*Assistant Examiner* — Jon T Schermerhorn
(74) *Attorney, Agent, or Firm* — Winston Hsu; Scott Margo (57) ABSTRACT

A heat dissipating device includes a base, a heat dissipating fin and a protruding member. The heat dissipating fin includes a heat dissipating portion, a fixing portion fixed in the base, and a first overflow-proof structure. The first overflow-proof structure is connected between the heat dissipating portion and the fixing portion. A width of the first overflow-proof structure is larger than a width of the heat dissipating portion. A first hole is formed on the heat dissipating portion and the first overflow-proof structure. The protruding member includes a second overflow-proof structure and a first protruding portion protruding from an upper surface of the second overflow-proof structure. The protruding member is disposed in the first hole, and a lower surface of the second overflow-proof structure and a lower surface of the first overflow-proof structure are coplanar.

17 Claims, 15 Drawing Sheets

HEAT DISSIPATING DEVICE

BACKGROUND OF THE INVENTION

1. Field of the Invention

The invention relates to a heat dissipating device and, more particularly, to a heat dissipating device with a heat dissipating fin and a protruding member capable of preventing overflow during manufacturing process.

2. Description of the Prior Art

Heat dissipating device is a significant component for electronic products. When an electronic product is operating, the current in circuit will generate unnecessary heat due to impedance. If the heat is accumulated in the electronic components of the electronic product without dissipating immediately, the electronic components may get damage due to the accumulated heat. Therefore, the performance of heat dissipating device is a significant issue for the electronic product.

Figure 1:
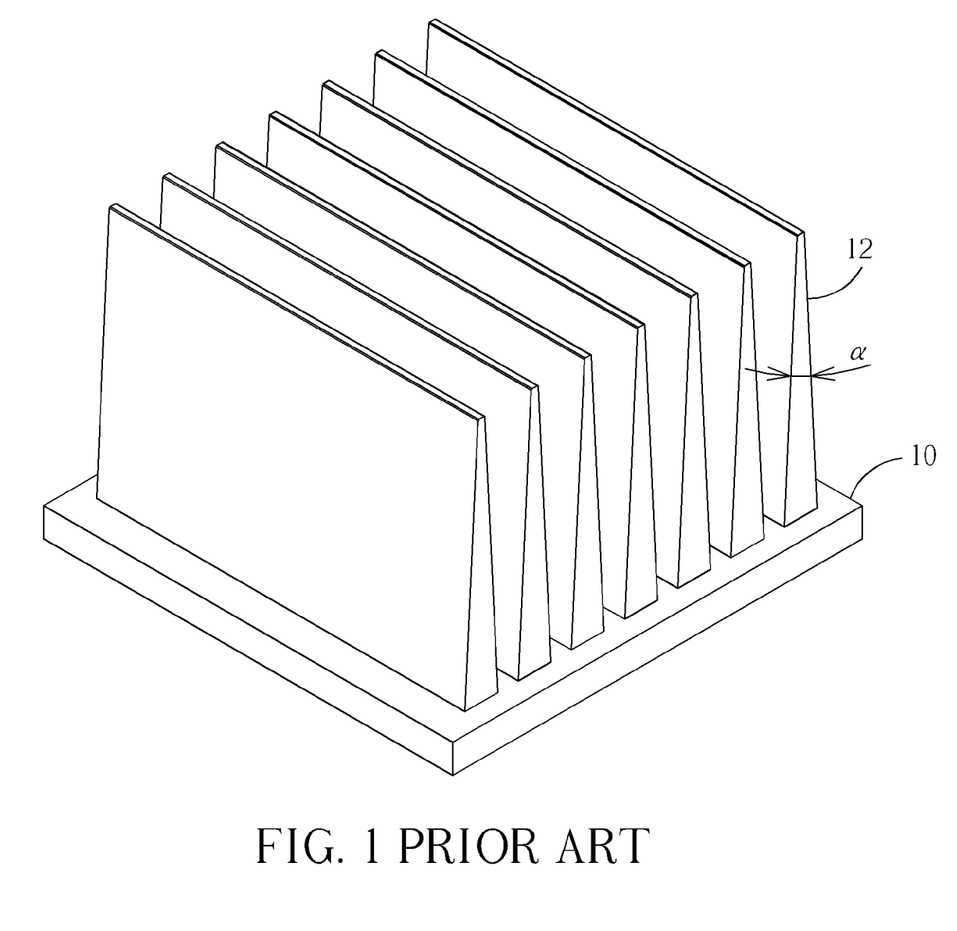
FIG. 1 is a schematic diagram illustrating a flat-type heat dissipating fin of the prior art.

Referring to FIG. 1, FIG. 1 is a schematic diagram illustrating a flat-type heat dissipating fin 12 of the prior art. In general, a heat dissipating device is usually equipped with a flat-type heat dissipating fin 12 shown in FIG. 1. As shown in FIG. 1, the flat-type heat dissipating fin 12 is formed with the base 10 integrally by a die casting process. Due to the requirement of mold stripping during the die casting process, the flat-type heat dissipating fin 12 has a draft angle α between 2 degrees and 3 degrees so that the whole weight is heavy and the height of the fin is limited. Furthermore, the number of heat dissipating fins is reduced in the heat dissipating device due to the draft angle α so that the heat dissipating area is not enough and the heat dissipating efficiency is worse. Moreover, since the conventional base 10 is formed as flat plates, once a heat dissipating device is attached on an outdoor electronic device with the base 10, the electronic device will be exposed out of the periphery of the base 10. Consequently, the electronic device will be battered and damaged by wind and rain.

SUMMARY OF THE INVENTION

The invention provides a heat dissipating device with a heat dissipating fin and a protruding member capable of preventing overflow during manufacturing process. The heat dissipating fin is formed by a forming process without the draft angle of the conventional heat dissipating fin.

The invention further provides a heat dissipating device with a box capable of accommodating electronic device(s) such that the heat dissipating device can be used outside.

According to an embodiment of the invention, a heat dissipating device comprises a base, a heat dissipating fin and a protruding member. The heat dissipating fin comprises a heat dissipating portion, a fixing portion and a first overflow-proof structure. The fixing portion is fixed in the base and the first overflow-proof structure is connected between the heat dissipating portion and the fixing portion. A width of the first overflow-proof structure is larger than a width of the heat dissipating portion. A first hole is formed on the heat dissipating portion and the first overflow-proof structure. The protruding member comprises a second overflow-proof structure and a first protruding portion. The first protruding portion protrudes from an upper surface of the second overflow-proof structure. The protruding member is disposed in the first hole. A lower surface of the second overflow-proof structure and a lower surface of the first overflow-proof structure are coplanar.

In this embodiment, the base may comprise a substrate and a box, wherein the substrate and the box are formed integrally and the box has an accommodating space therein.

As mentioned in the above, the invention forms the heat dissipating fin and the protruding member by a forming process (e.g. aluminum extrusion process) first, punches the first hole on the heat dissipating fin by a punch process, disposes the protruding member in the first hole, and then forms the base, which covers the fixing portion of the heat dissipating fin, by a die casting process with melt metal material. The heat dissipating fin and the protruding member of the invention both have overflow-proof structures capable of preventing the melt metal material from overflowing during the die casting process so as to prevent deckle edge from being generated. Since the heat dissipating fin of the invention is formed by the forming process, the draft angle of the conventional heat dissipating fin is unnecessary for the heat dissipating fin of the invention. Therefore, the whole weight of the heat dissipating fin of the invention can be lighter and the height of the heat dissipating fin of the invention can be higher than the prior art. Furthermore, the number of heat dissipating fins of the invention can be increased in the heat dissipating device so that the heat dissipating area can be increased and the heat dissipating efficiency can be enhanced. When the heat dissipating device of the invention is installed outside, electronic device(s) can be accommodated in the accommodating space within the box of the base so as to protect the electronic device(s) from being battered and damaged by wind and rain.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
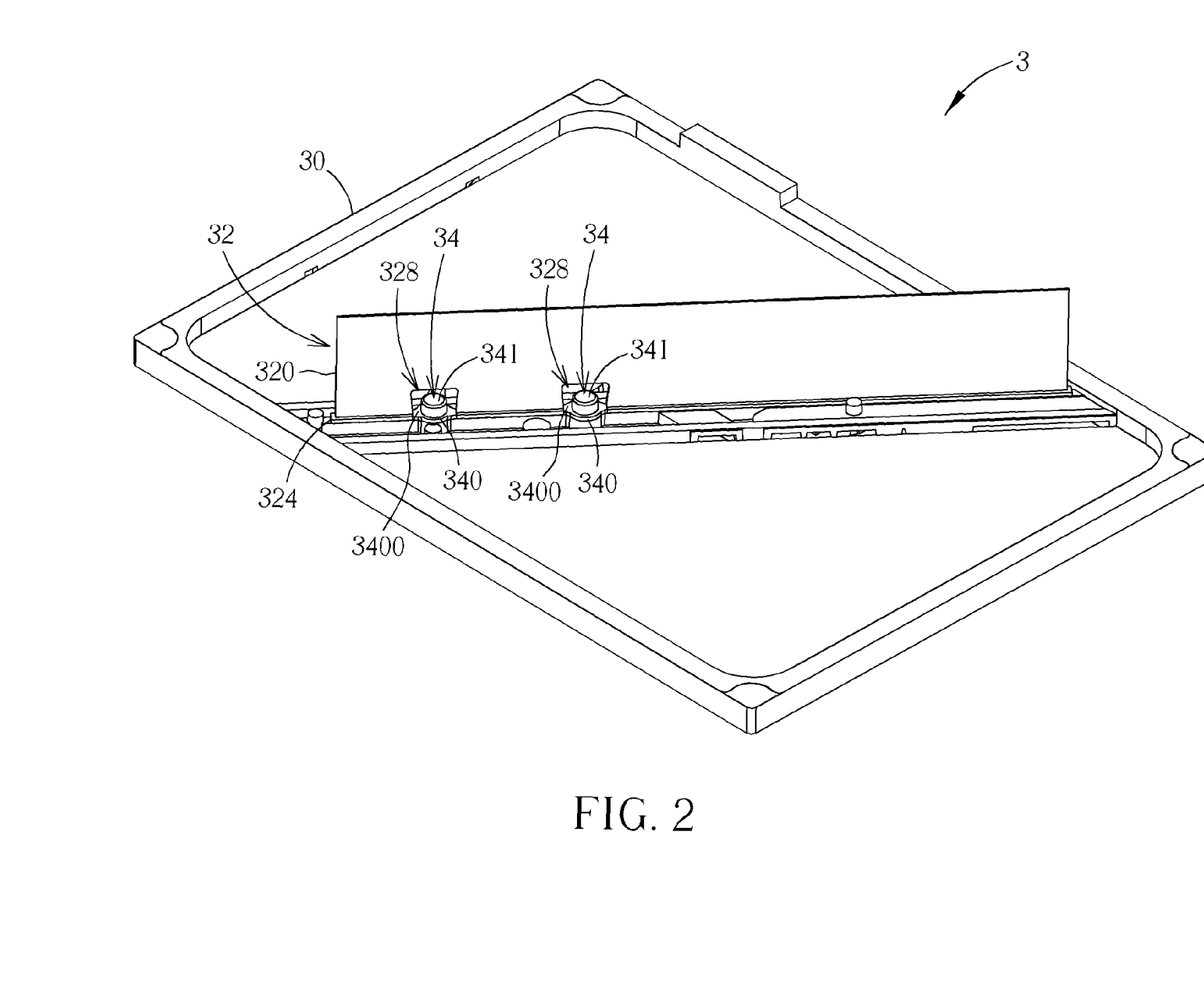
FIG. 2 is a schematic diagram illustrating a heat dissipating device according to an embodiment of the invention.
Figure 3:
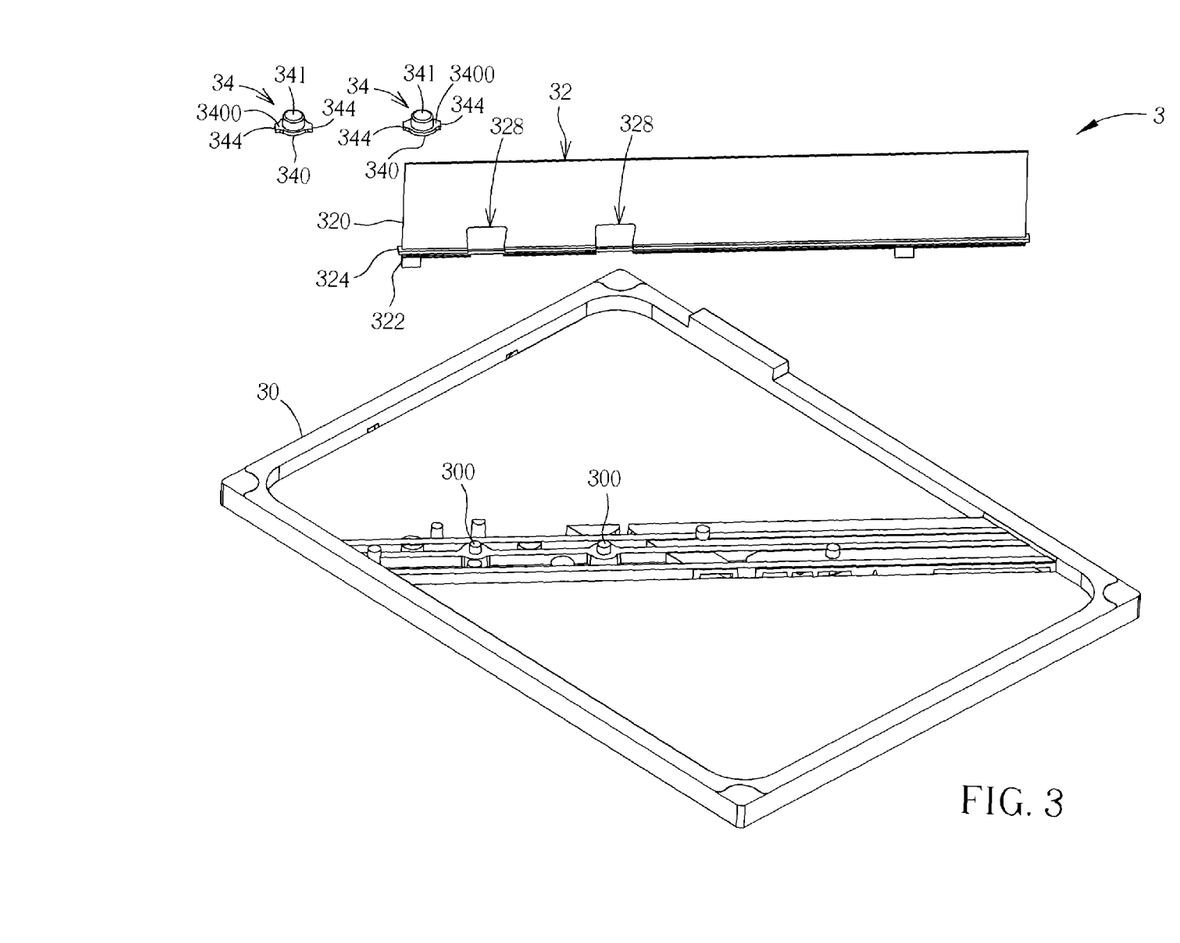
FIG. 3 is an exploded view illustrating the heat dissipating device shown in FIG. 2.
Figure 4:
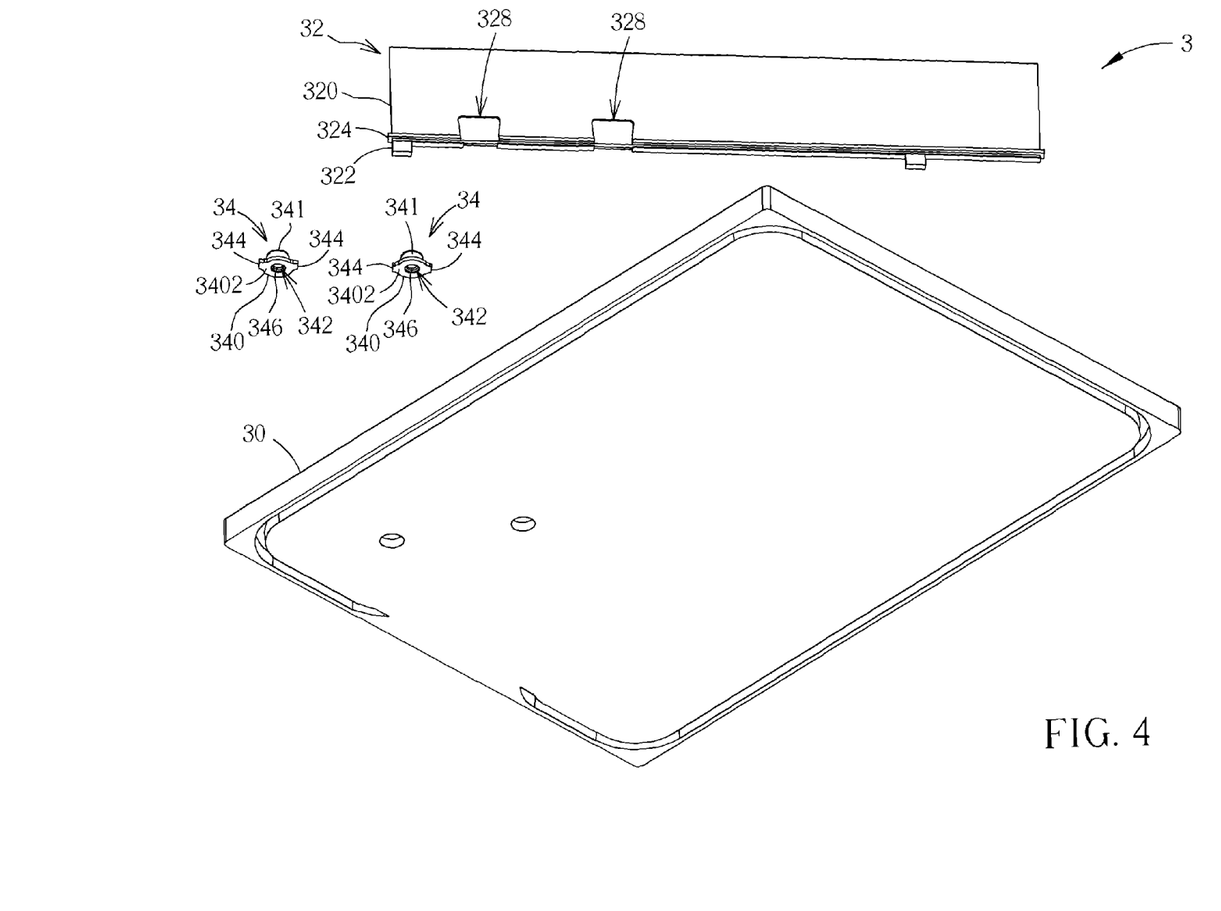
FIG. 4 is an exploded view illustrating the heat dissipating device shown in FIG. 2 from another view angle.
Figure 5:
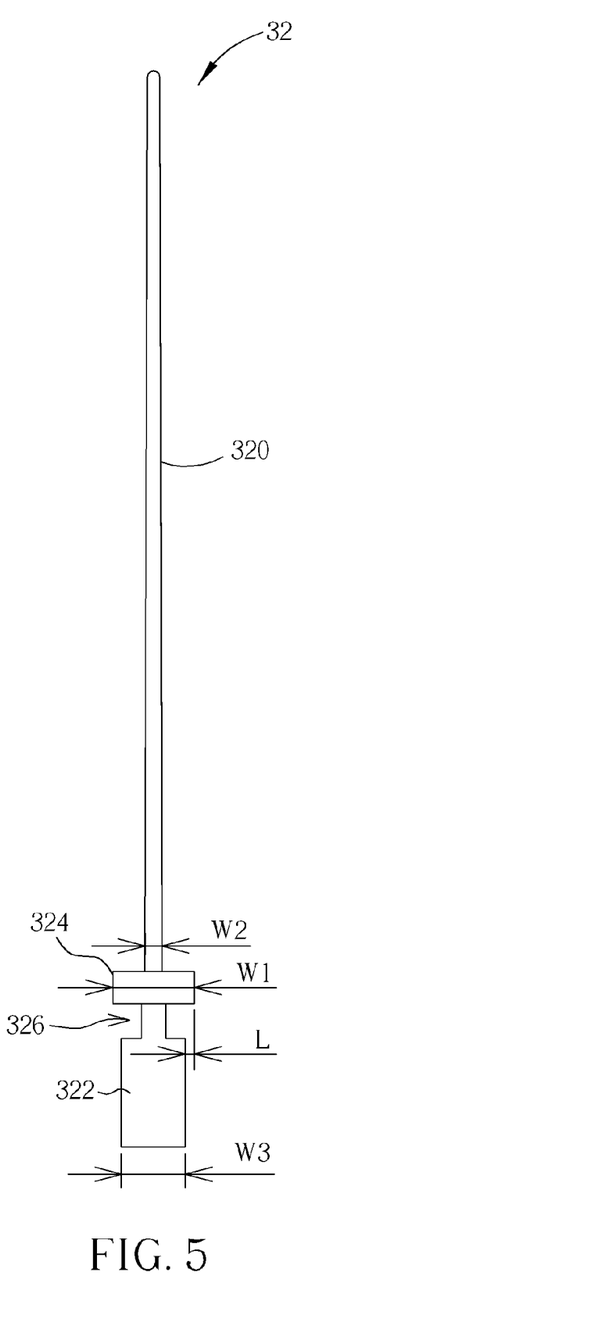
FIG. 5 is a side view illustrating the heat dissipating fin shown in FIG. 2.
Figure 6:
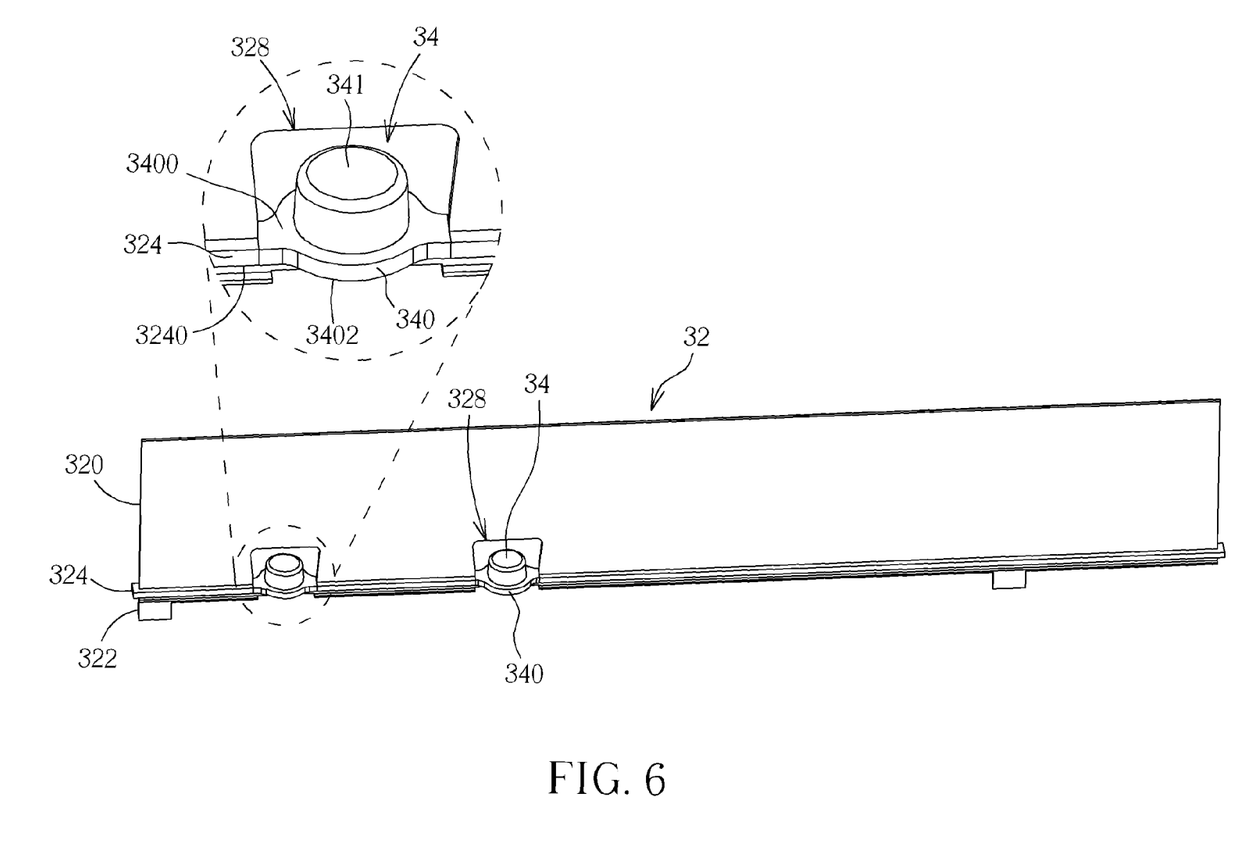
FIG. 6 is an assembly view illustrating the heat dissipating fin and the protruding member shown in FIG. 2.

Referring to FIGS. 2 to 6, FIG. 2 is a schematic diagram illustrating a heat dissipating device 3 according to an embodiment of the invention, FIG. 3 is an exploded view illustrating the heat dissipating device 3 shown in FIG. 2, FIG. 4 is an exploded view illustrating the heat dissipating device 3 shown in FIG. 2 from another view angle, FIG. 5 is a side view illustrating the heat dissipating fin 32 shown in FIG. 2, and FIG. 6 is an assembly view illustrating the heat dissipating fin 32 and the protruding member 34 shown in FIG. 2. As shown in FIGS. 2 to 4, the heat dissipating device 3 comprises a base 30, a heat dissipating fin 32 and two protruding members 34. The base 30 comprises two pillars 300. In this embodiment, a screw hole may be formed on a back surface of the pillar 300 and used for fixing a heat generating component (e.g. circuit board) onto the base 30.

The heat dissipating fin 32 comprises a heat dissipating portion 320, a fixing portion 322 and a first overflow-proof structure 324. The fixing portion 322 is fixed in the base 30. The first overflow-proof structure 324 is connected between the heat dissipating portion 320 and the fixing portion 322. A width W1 of the first overflow-proof structure 324 is larger than a width W2 of the heat dissipating portion 320 and larger than a width W3 of the fixing portion 322. In this embodiment, a length L of the first overflow-proof structure 324 protruded from the fixing portion 322 can be between 1 mm and 10 mm, wherein a thickness of the first overflow-proof structure 324 is uniform. In another embodiment, a thickness of the first overflow-proof structure 324 may vary gradiently. It should be noted that the width W3 of the fixing portion 322 may be also larger than or equal to the width W1 of the first overflow-proof structure 324 based on practical applications.

Furthermore, the heat dissipating fin 32 may further comprise a recess structure 326 formed on the fixing portion 322. In this embodiment, the recess structure 326 is rectangular. In another embodiment, the recess structure 326 may be arc-shaped or polygon-shaped.

Two first holes 328 are formed on the heat dissipating portion 320 and the first overflow-proof structure 324. The positions of the two first holes 328 are corresponding to the positions of the two pillars 300 of the base 30. In this embodiment, the heat dissipating fin 32 may be formed by a forming process (e.g. aluminum extrusion process) first and then the first holes 328 may be formed on the heat dissipating fin 32 by a punching process.

Each of the protruding members 34 comprises a second overflow-proof structure 340 and a first protruding portion 341 protruding from an upper surface 3400 of the second overflow-proof structure 340. A second hole 342 is formed on a lower surface 3402 of the second overflow-proof structure 340 and is deep into the first protruding portion 341. There are two flat surfaces 344 on opposite sides of the second overflow-proof structure 340. Furthermore, the protruding member 34 may further comprise an engaging structure 346 located in the second hole 342. For simplifying manufacturing process, the engaging structure 346 may be formed as, but not limited to, a screw thread. In this embodiment, the protruding member 34 may be formed by a forming process (e.g. aluminum extrusion process) first and then the second hole 342 with the engaging structure 346 may be formed on the lower surface 3402 of the second overflow-proof structure 340 by a drilling process.

Figure 7:
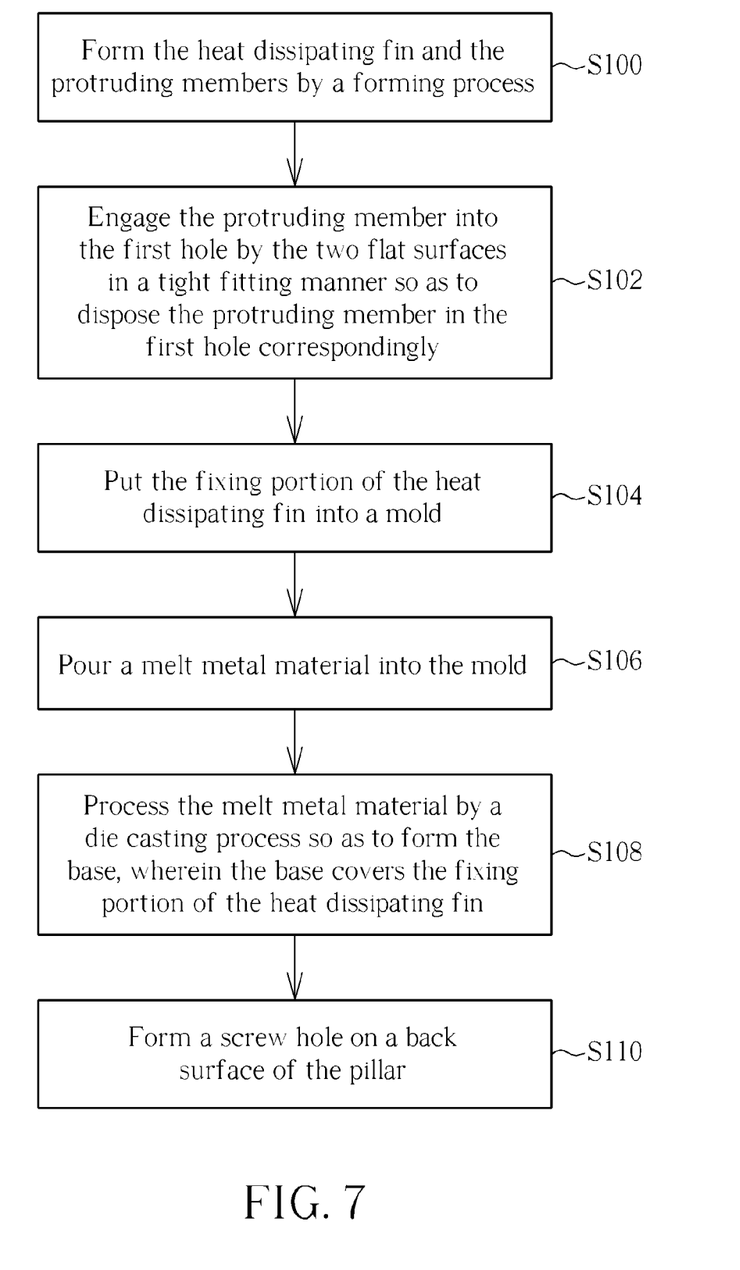
FIG. 7 is a flowchart illustrating a method of manufacturing the heat dissipating device shown in FIG. 2.

Referring to FIG. 7, FIG. 7 is a flowchart illustrating a method of manufacturing the heat dissipating device 3 shown in FIG. 2. First of all, step S100 is performed to form the heat dissipating fin 32 and the protruding members 34 by a forming process. In this embodiment, the aforesaid forming process may be an aluminum extrusion process so as to form the heat dissipating fin 32 as a flat-type heat dissipating fin. Afterward, step S102 is performed to engage the protruding member 34 into the first hole 328 by the two flat surfaces 344 in a tight fitting manner so as to dispose the protruding member 34 in the first hole 328 correspondingly. At this time, the protruding member 34 is above the fixing portion 322 and the lower surface 3402 of the second overflow-proof structure 340 and a lower surface 3240 of the first overflow-proof structure 324 are coplanar, as shown in FIG. 6.

In this embodiment, the first hole 328 may have a broader upper portion and a narrower lower portion by the punching process such that the protruding member 34 can be disposed into the first hole 328 easily. Step S104 is then performed to put the fixing portion 322 of the heat dissipating fin 32 into a mold (not shown). Step S106 is then performed to pour a melt metal material (e.g. aluminum, etc.) into the mold. Step S108 is then performed to process the melt metal material by a die casting process so as to form the base 30, wherein the base 30 covers the fixing portion 322 of the heat dissipating fin 32.

When the base 30 is formed, the melt metal material will flow into the second hole 342 of the protruding member 34 and form the pillar 300. In other words, the pillar 300 is accommodated in the second hole 342 of the protruding member 34 after the base 30 is formed. Finally, step S110 is performed to form a screw hole on a back surface of the pillar 300, wherein the screw hole may be used for fixing a heat generating component (e.g. circuit board) onto the base 30.

In this embodiment, the first overflow-proof structure 324 of the heat dissipating fin 32 and the second overflow-proof structure 340 of the protruding member 34 can prevent the melt metal material from overflowing during the die casting process so as to prevent deckle edge from being generated. When the length L of the first overflow-proof structure 324 protruded from the fixing portion 322 is between 1 mm and 10 mm, the first overflow-proof structure 324 can prevent the melt metal material from overflowing during the die casting process effectively so as to prevent deckle edge from being generated.

The length of the second overflow-proof structure 340 may be designed based on the length of the first overflow-proof structure 324. Furthermore, the recess structure 326 of the heat dissipating fin 32 and the engaging structure 346 of the protruding member 34 can hold the metal material effectively so as to enhance the combination strength between the base 30 and the heat dissipating fin 32 and enhance the combination strength between the base 30 and the protruding member 34.

Figure 8:
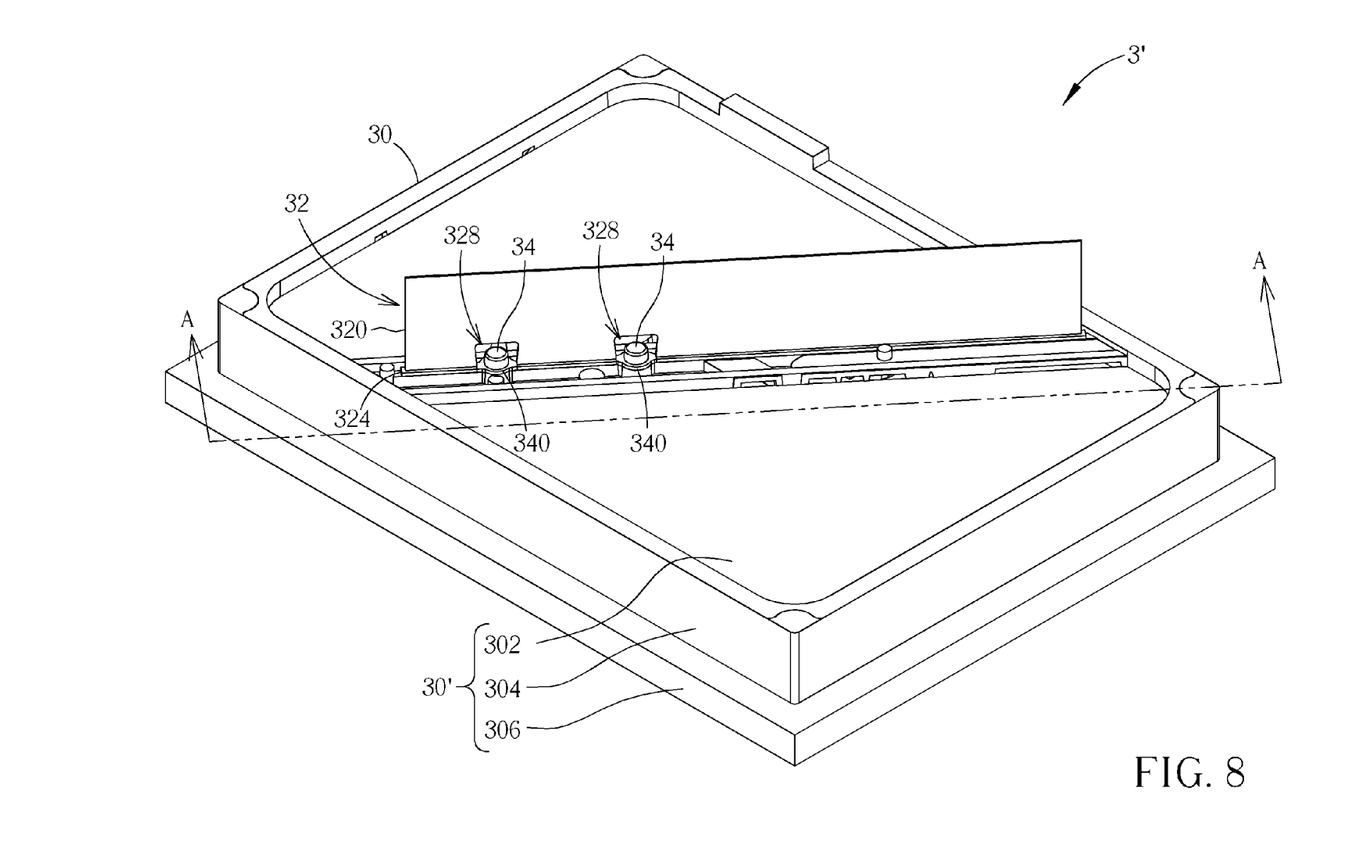
FIG. 8 is a schematic diagram illustrating a heat dissipating device according to a second embodiment of the invention.
Figure 9:
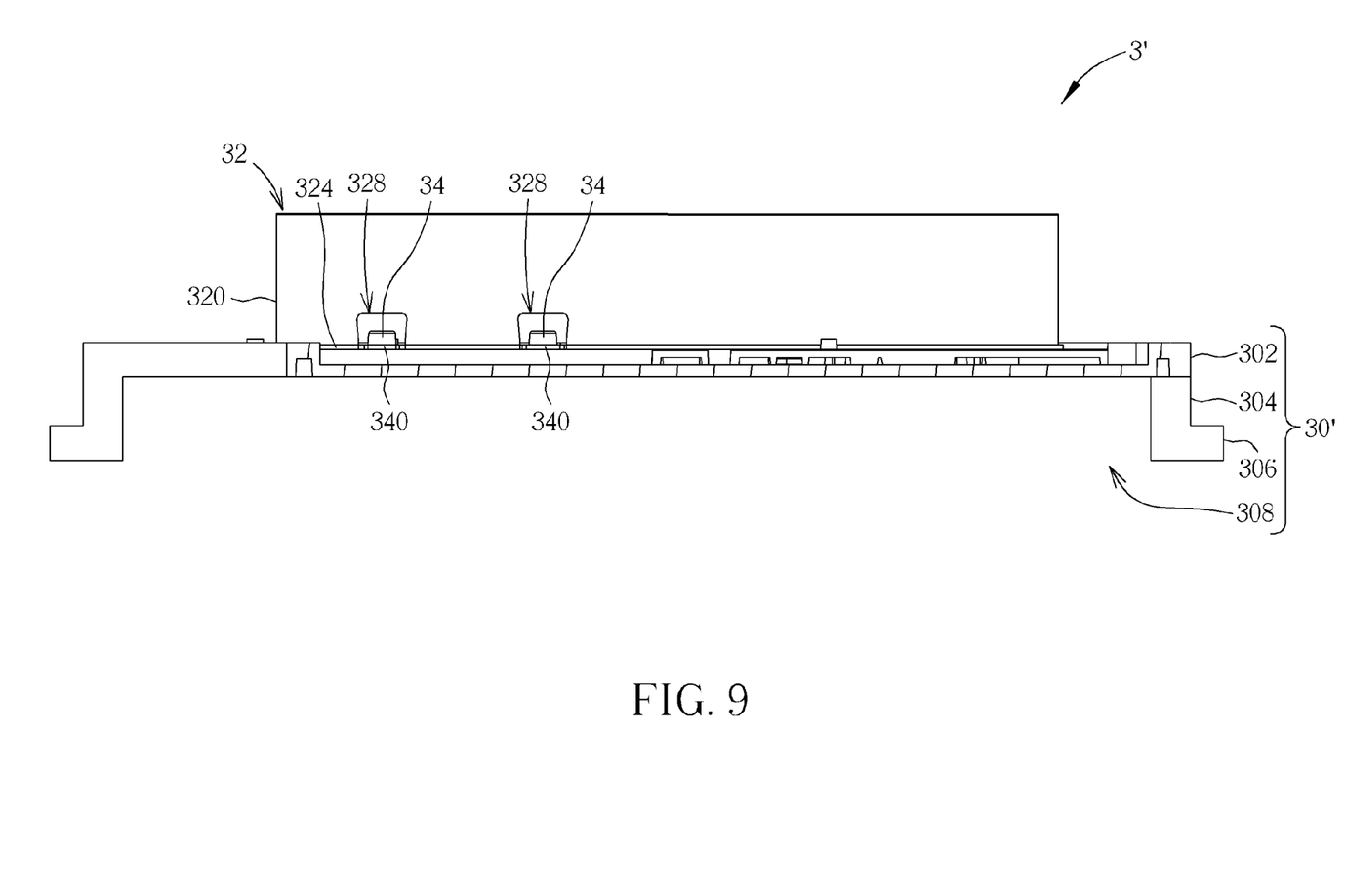
FIG. 9 is a cross-sectional view illustrating the heat dissipating device along line A-A shown in FIG. 8.

Referring to FIGS. 8 and 9 along with FIG. 2, FIG. 8 is a schematic diagram illustrating a heat dissipating device 3' according to a second embodiment of the invention, and FIG. 9 is a cross-sectional view illustrating the heat dissipating device 3' along line A-A shown in FIG. 8. The difference between the heat dissipating device 3' and the aforesaid heat dissipating device 3 is that the base 30' of the heat dissipating device 3' comprises a substrate 302, a box 304 and a flange 306, wherein the substrate 302 and the box 304 are formed integrally, the box 304 has an accommodating space 308 therein, and the flange 306 protrudes from a periphery of the box 304. In practical applications, the flange 306 may be fixed on a plane by screw, rivet, soldering or other fixing manners so as to fix the heat dissipating device 3' on the plane. When the heat dissipating device 3' of the invention is installed outside (e.g. outdoor base station), electronic device(s) can be accommodated in the accommodating space 308 within the box 304 of the base 30' so as to protect the electronic device(s) from being battered and damaged by wind and rain. It should be noted that the same elements in FIGS. 8-9 and FIG. 2 are represented by the same numerals, so the repeated explanation will not be depicted herein again.

Figure 10:
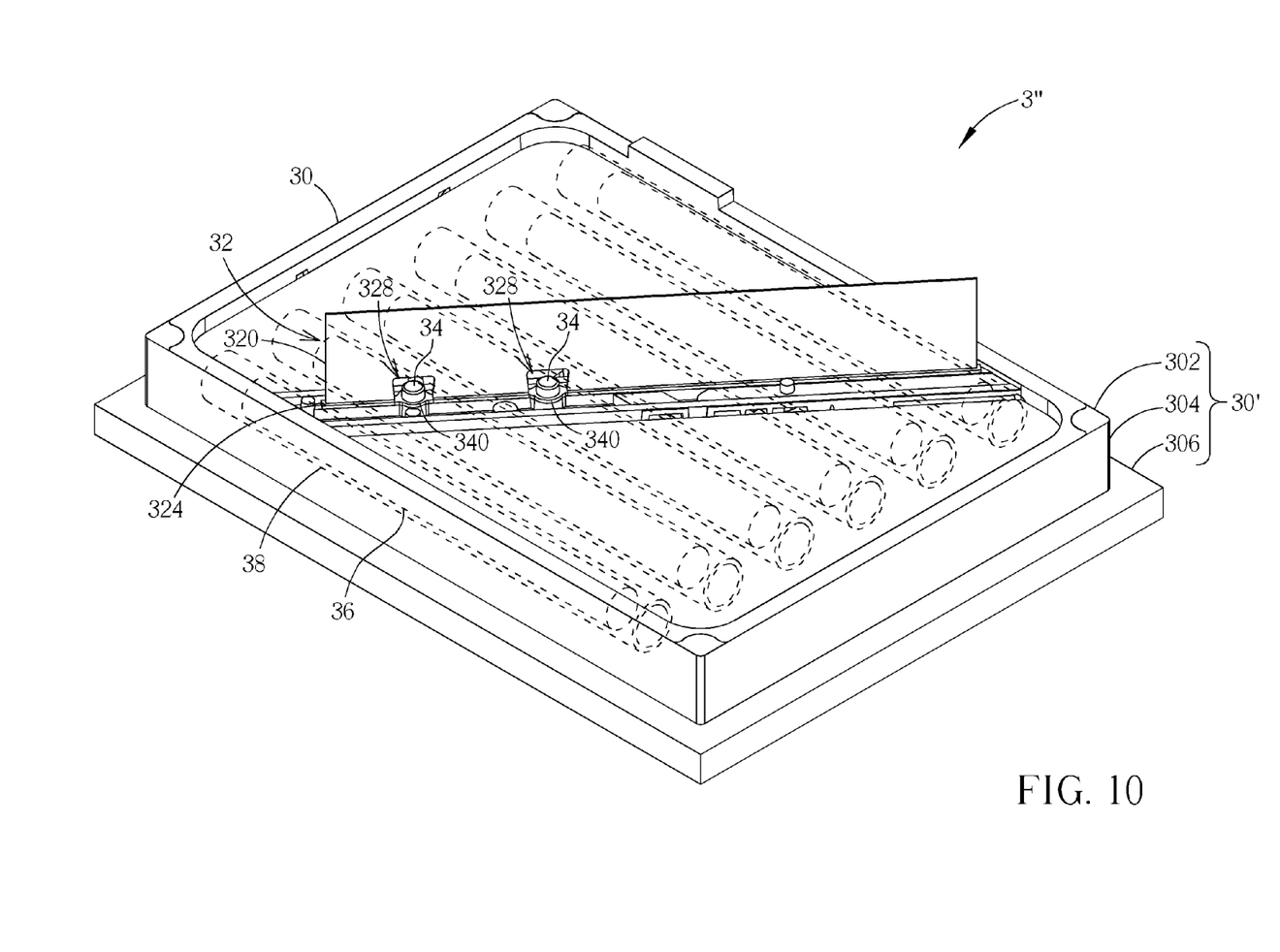
FIG. 10 is a schematic diagram illustrating a heat dissipating device according to a third embodiment of the invention.

Referring to FIG. 10 along with FIG. 2, FIG. 10 is a schematic diagram illustrating a heat dissipating device 3" according to a third embodiment of the invention. The difference between the heat dissipating device 3" and the aforesaid heat dissipating device 3' is that the heat dissipating device 3' further comprises a plurality of heat pipes 36 disposed in the substrate 302 of the base 30' so as to enhance heat dissipating efficiency. It should be noted that if the base 30' is formed by aluminum die casting process, each of the heat pipes 36 may be disposed in an aluminum sleeve 38 and then the heat pipe 36 and the aluminum sleeve 38 are put into a mold with the heat dissipating fin 32 for die casting process. Accordingly, the combination strength between the heat pipes 36 and the base 30' can be enhanced. Furthermore, the same elements in FIG. 10 and FIG. 2 are represented by the same numerals, so the repeated explanation will not be depicted herein again.

It should be noted that the heat pipe 36 and the aluminum sleeve 38 may be also disposed in the base 30 shown in FIG. 2 according to practical applications.

Figure 11:
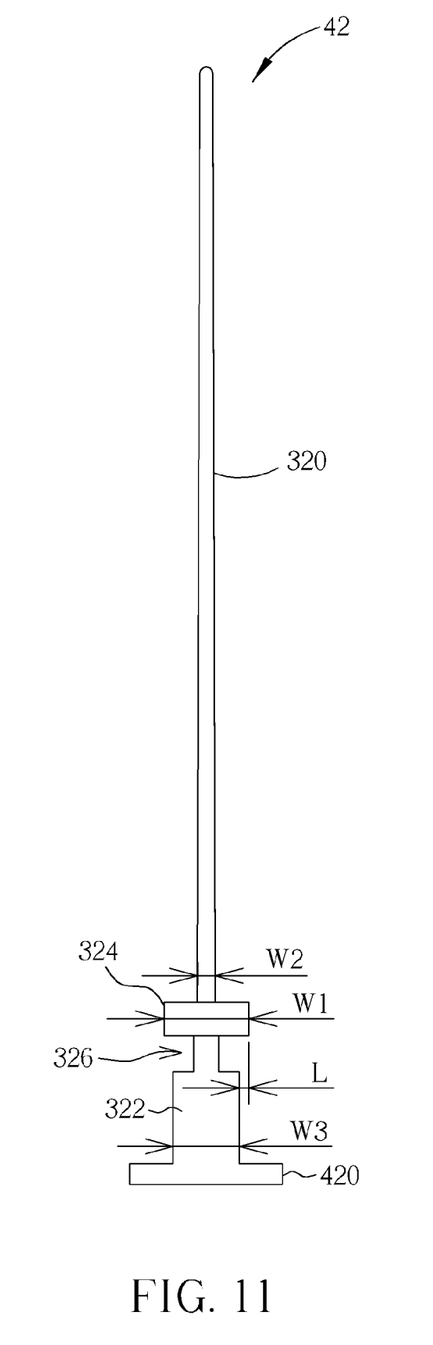
FIG. 11 is a side view illustrating a heat dissipating fin according to a fourth embodiment of the invention.

Referring to FIG. 11 along with FIG. 5, FIG. 11 is a side view illustrating a heat dissipating fin 42 according to a fourth embodiment of the invention. The difference between the heat dissipating fin 42 and the aforesaid heat dissipating fin 32 is that the heat dissipating fin 42 further comprises a protruding structure 420. As shown in FIG. 11, the protruding structure 420 protrudes from one end of the fixing portion 322. When the heat dissipating fin 32 shown in FIG. 2 is replaced by the heat dissipating fin 42 shown in FIG. 11, the protruding structure 420 of the heat dissipating fin 42 can cooperate with the first overflow-proof structure 324 to hold the metal material so as to enhance the combination strength between the base 30 and the heat dissipating fin 42. It should be noted that the same elements in FIG. 11 and FIG. 5 are represented by the same numerals, so the repeated explanation will not be depicted herein again. Moreover, the heat dissipating fin 42 can be also formed by the forming process of the aforesaid step S100.

Figure 12:
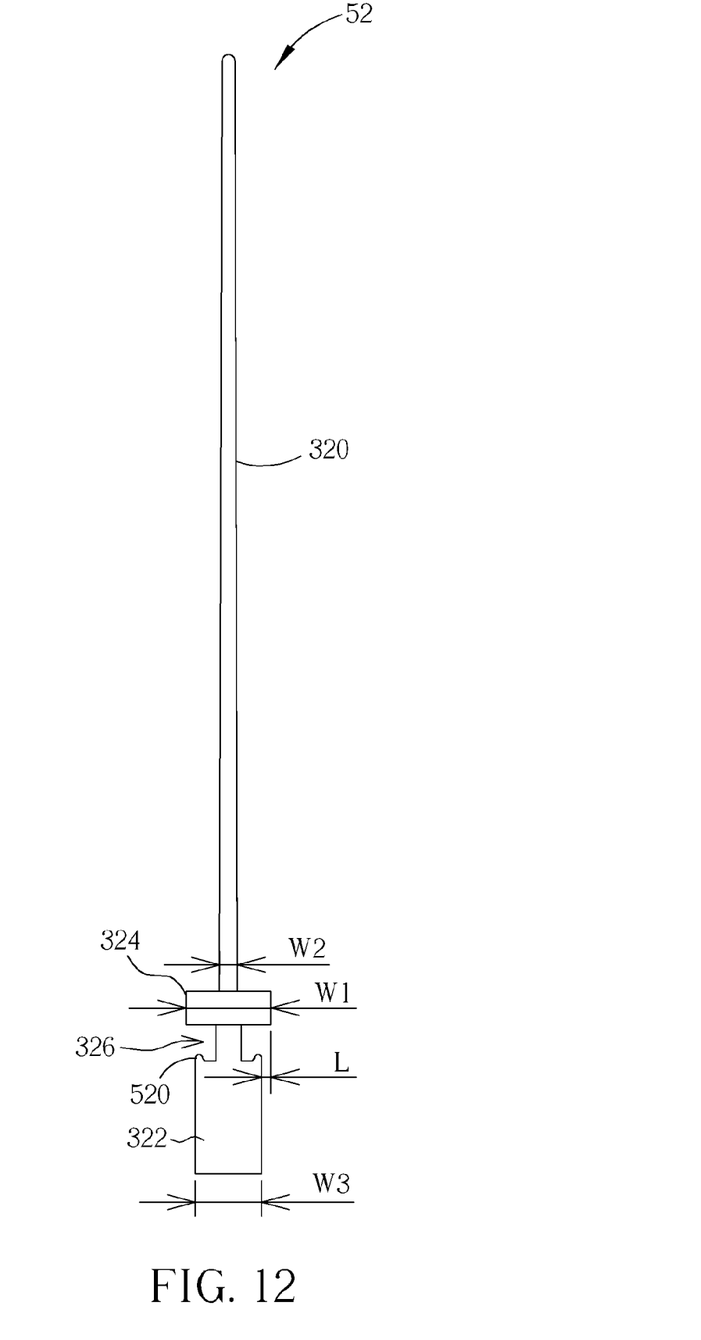
FIG. 12 is a side view illustrating a heat dissipating fin according to a fifth embodiment of the invention.

Referring to FIG. 12 along with FIG. 5, FIG. 12 is a side view illustrating a heat dissipating fin 52 according to a fifth embodiment of the invention. The difference between the heat dissipating fin 52 and the aforesaid heat dissipating fin 32 is that the heat dissipating fin 52 further comprises a hook structure 520. As shown in FIG. 12, the hook structure 520 is formed in the recess structure 326. When the heat dissipating fin 32 shown in FIG. 2 is replaced by the heat dissipating fin 52 shown in FIG. 12, the hook structure 520 of the heat dissipating fin 52 can hook the metal material so as to enhance the combination strength between the base 30 and the heat dissipating fin 52. It should be noted that the same elements in FIG. 12 and FIG. 5 are represented by the same numerals, so the repeated explanation will not be depicted herein again. Moreover, the heat dissipating fin 52 can be also formed by the forming process of the aforesaid step S100.

Figure 13:
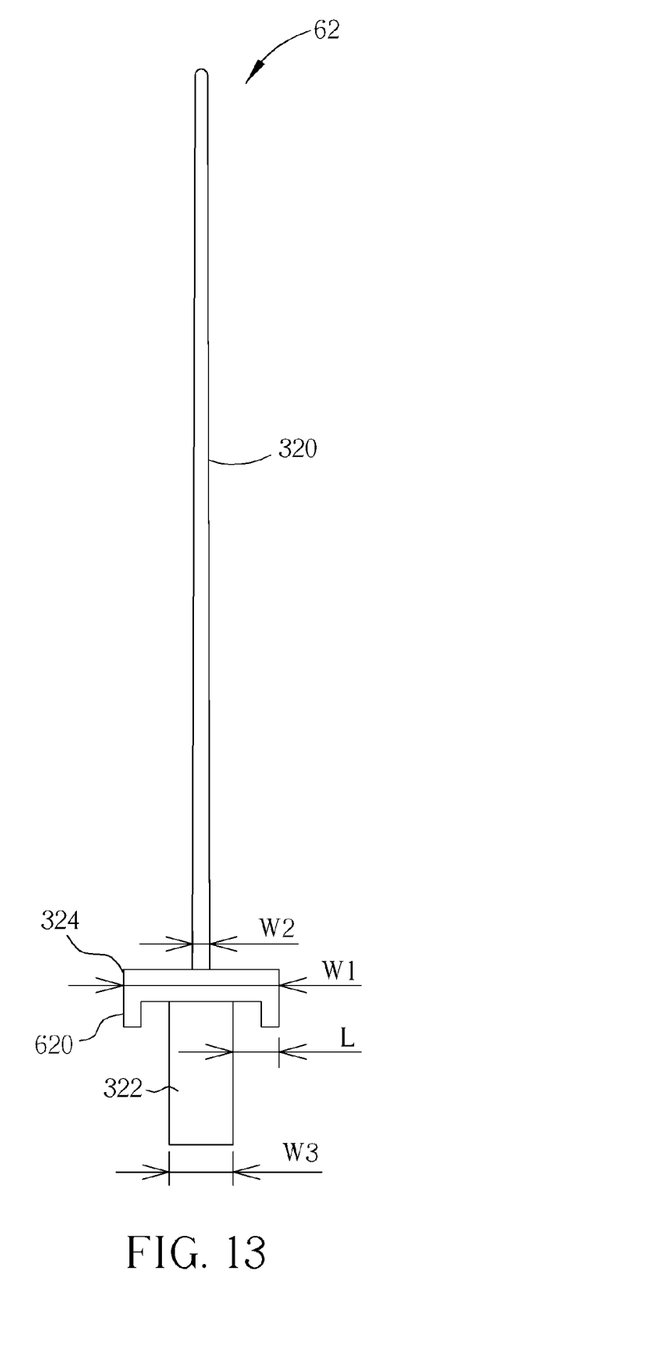
FIG. 13 is a side view illustrating a heat dissipating fin according to a sixth embodiment of the invention.

Referring to FIG. 13 along with FIG. 5, FIG. 13 is a side view illustrating a heat dissipating fin 62 according to a sixth embodiment of the invention. The difference between the heat dissipating fin 62 and the aforesaid heat dissipating fin 32 is that the heat dissipating fin 62 further comprises an extending structure 620 and does not comprise the aforesaid recess structure 326. As shown in FIG. 13, the extending structure 620 is extended from the first overflow-proof structure 324 toward the fixing portion 322, and the first overflow-proof structure 324 and the extending structure 620 are formed as U-shape. When the heat dissipating fin 32 shown in FIG. 2 is replaced by the heat dissipating fin 62 shown in FIG. 13, the extending structure 620 of the heat dissipating fin 62 can cooperate with the first overflow-proof structure 324 to hold the metal material so as to enhance the combination strength between the base 30 and the heat dissipating fin 62. It should be noted that the same elements in FIG. 13 and FIG. 5 are represented by the same numerals, so the repeated explanation will not be depicted herein again. Moreover, the heat dissipating fin 62 can be also formed by the forming process of the aforesaid step S100.

Figure 14:
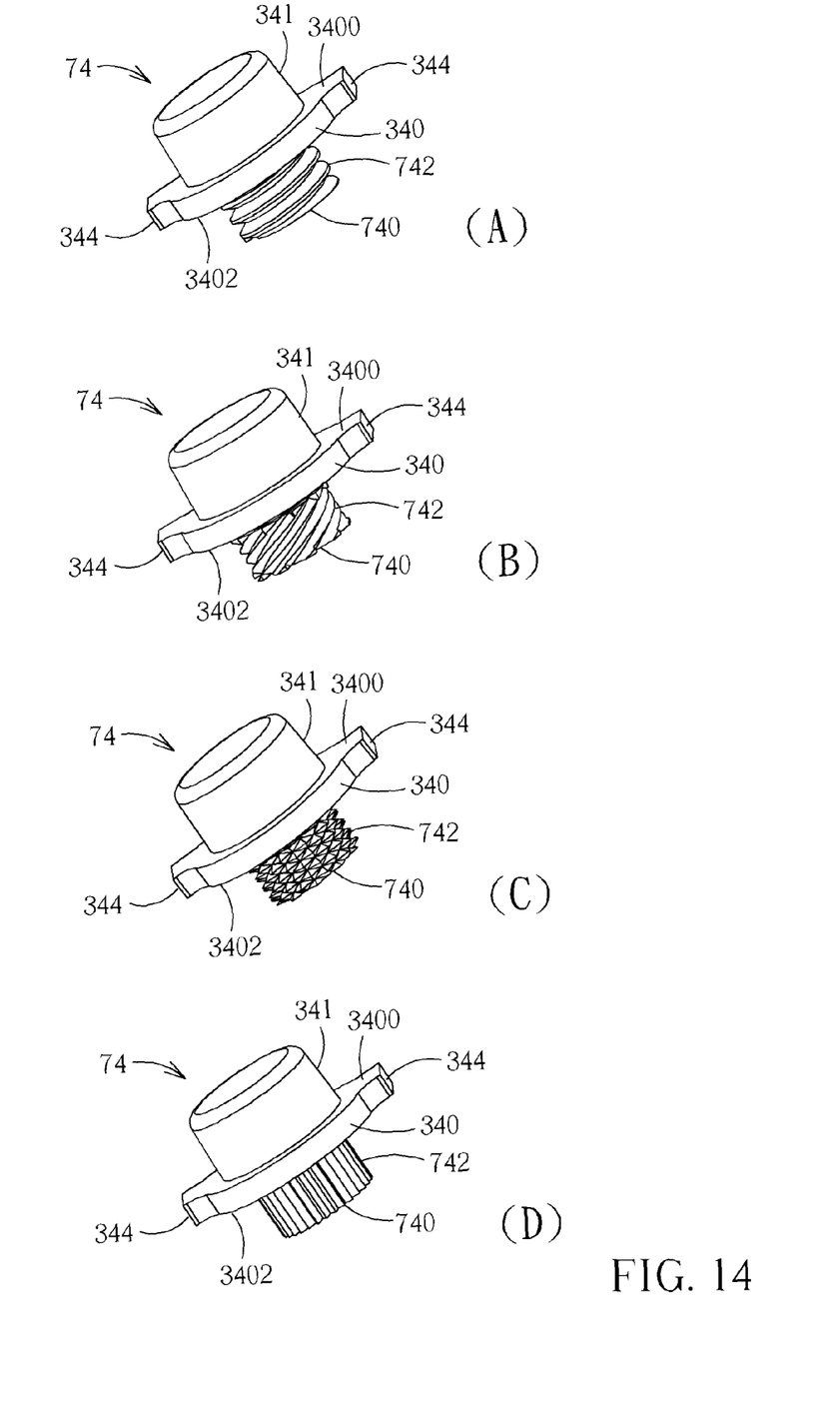
FIG. 14 is a perspective view illustrating four types of protruding members according to a seventh embodiment of the invention.
Figure 15:
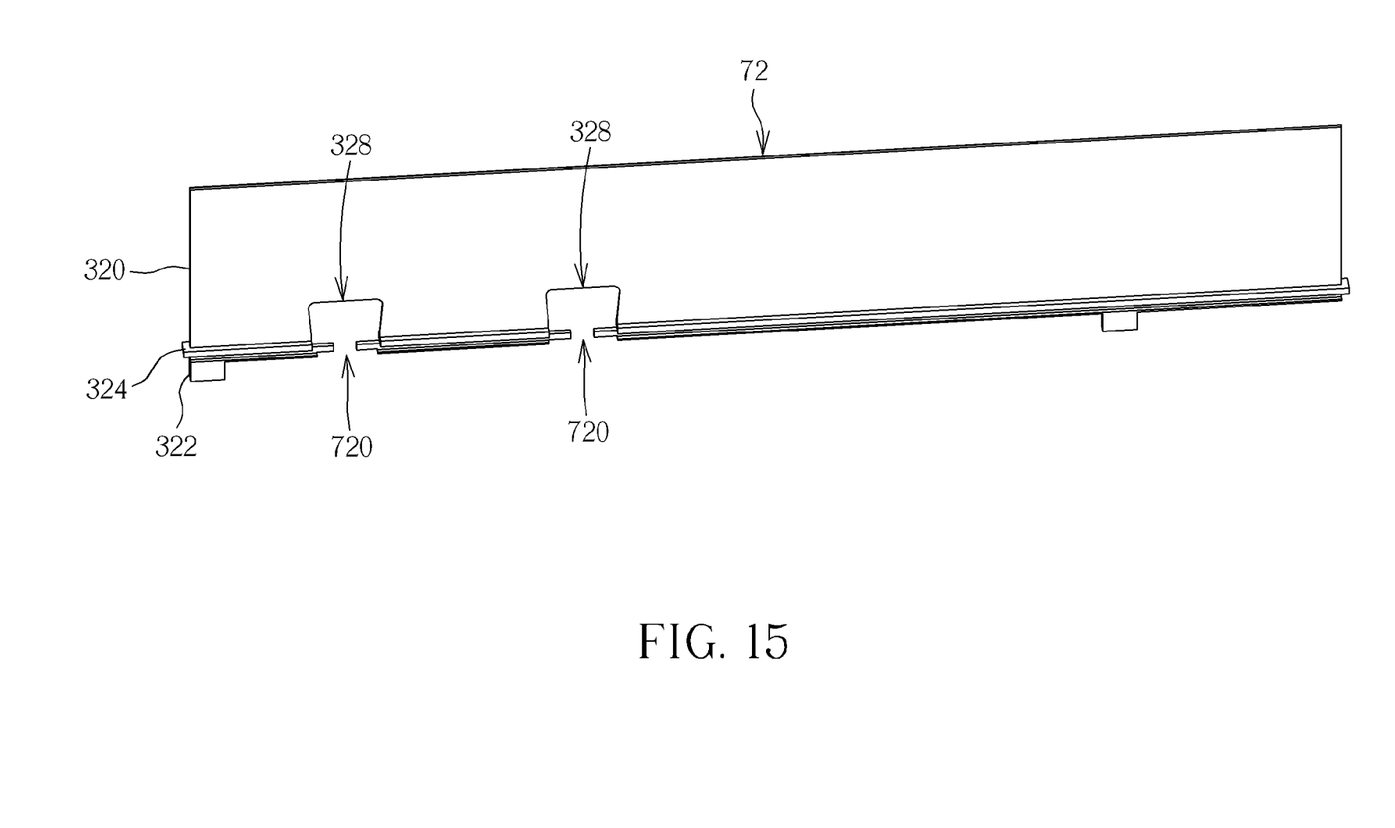
FIG. 15 is a perspective view illustrating a heat dissipating fin adapted for the protruding members shown in FIG. 14.

Referring to FIGS. 14 and 15 along with FIGS. 3 and 4, FIG. 14 is a perspective view illustrating four types of protruding members 74 according to a seventh embodiment of the invention, and FIG. 15 is a perspective view illustrating a heat dissipating fin 72 adapted for the protruding members 74 shown in FIG. 14. The difference between the protruding member 74 and the aforesaid protruding member 34 is that the protruding member 74 further comprises a second protruding portion 740 protruding from the lower surface 3402 of the second overflow-proof structure 340. In other words, the second protruding portion 740 and the first protruding portion 341 are connected to opposite sides of the second overflow-proof structure 340, respectively.

Furthermore, an engaging structure 742 is formed on a surface of the second protruding portion 740. As shown in FIG. 14(A), the engaging structure 742 is a screw thread; as shown in FIG. 14(B), the engaging structure 742 is an oblique thread; as shown in FIG. 14(C), the engaging structure 742 is a meshed thread; and as shown in FIG. 14(D), the engaging structure 742 is a straight thread. As shown in FIG. 15, a third hole 720 is formed on the fixing portion 322 of the heat dissipating fin 72. When the protruding member 74 is disposed in the first hole 328 of the heat dissipating fin 72, the protruding member 74 is engaged in the first hole 328 by the two flat surfaces 344 in a tight fitting manner and the second protruding portion 740 is accommodated in the third hole 720. It should be noted that the same elements in FIGS. 14-15 and FIGS. 3-4 are represented by the same numerals, so the repeated explanation will not be depicted herein again.

The heat dissipating fin 32 and the protruding member 34 shown in FIG. 2 may be replaced by the protruding member 74 shown in FIG. 14 and the heat dissipating fin 72 shown in FIG. 15. When the base 30 is formed, the melt metal material will cover the fixing portion 322 of the heat dissipating fin 72 and the second protruding portion 740 of the protruding member 74. In other words, the second protruding portion 740 of the protruding member 74 is fixed in the base 30 after the base 30 is formed. The engaging structure 742 of the protruding member 74 can hold the metal material effectively so as to enhance the combination strength between the base 30 and the heat dissipating fin 72 and enhance the combination strength between the base 30 and the protruding member 74.

As mentioned in the above, the invention forms the heat dissipating fin and the protruding member by a forming process (e.g. aluminum extrusion process) first, punches the first hole on the heat dissipating fin by a punching process, disposes the protruding member in the first hole, and then forms the base, which covers the fixing portion of the heat dissipating fin, by a die casting process with melt metal material. The heat dissipating fin and the protruding member of the invention both have overflow-proof structures capable of preventing the melt metal material from overflowing during the die casting process so as to prevent deckle edge from being generated. Since the heat dissipating fin of the invention is formed by the forming process, the draft angle of the conventional heat dissipating fin is unnecessary for the heat dissipating fin of the invention. Therefore, the whole weight of the heat dissipating fin of the invention can be lighter and the height of the heat dissipating fin of the invention can be higher than the prior art. Furthermore, the number of heat dissipating fins of the invention can be increased in the heat dissipating device so that the heat dissipating area can be increased and the heat dissipating efficiency can be enhanced. Moreover, when the base is formed, the melt metal material will flow into the second hole of the protruding member and form the pillar. In practical applications, a screw hole may be formed on the back surface of the pillar, wherein the screw hole may be used for fixing a heat generating component (e.g. circuit board) onto the base. When the heat dissipating device of the invention is installed outside, electronic device(s) can be accommodated in the accommodating space within the box of the base so as to protect the electronic device(s) from being battered and damaged by wind and rain.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating device comprising:
   a base;
   a heat dissipating fin comprising a heat dissipating portion, a fixing portion and a first overflow-proof structure, the fixing portion being fixed in the base, the first overflow-proof structure being connected between the heat dissipating portion and the fixing portion, a width of the first overflow-proof structure being larger than a width of the heat dissipating portion, a first hole being formed on the heat dissipating portion and the first overflow-proof structure; and
   a protruding member comprising a second overflow-proof structure and a first protruding portion, the first protruding portion protruding from an upper surface of the second overflow-proof structure, the protruding member being disposed in the first hole, a lower surface of the second overflow-proof structure and a lower surface of the first overflow-proof structure being coplanar.

2. The heat dissipating device of claim 1, wherein there are two flat surfaces on opposite sides of the second overflow-proof structure, and the protruding member is engaged in the first hole by the two flat surfaces in a tight fitting manner.

3. The heat dissipating device of claim 1, wherein the base comprises a pillar, a second hole is formed on the lower surface of the second overflow-proof structure and is deep into the first protruding portion, and the pillar is accommodated in the second hole.

4. The heat dissipating device of claim 3, wherein the protruding member further comprises an engaging structure located in the second hole.

5. The heat dissipating device of claim 4, wherein the engaging structure is a screw thread.

6. The heat dissipating device of claim 1, wherein the protruding member further comprises a second protruding portion protruding from the lower surface of the second overflow-proof structure and fixed in the base, an engaging structure is formed on a surface of the second protruding portion, and a third hole is formed on the fixing portion and used for accommodating the second protruding portion.

7. The heat dissipating device of claim 6, wherein the engaging structure is a screw thread, an oblique thread, a meshed thread and a straight thread.

8. The heat dissipating device of claim 1, wherein the base comprises a substrate and a box, the substrate and the box are formed integrally, and the box has an accommodating space therein.

9. The heat dissipating device of claim 8, wherein the base further comprises a flange protruding from a periphery of the box.

10. The heat dissipating device of claim 1 further comprising a plurality of heat pipes disposed in the base.

11. The heat dissipating device of claim 1, wherein the width of the first overflow-proof structure is larger than a width of the fixing portion.

12. The heat dissipating device of claim 11, wherein a length of the first overflow-proof structure protruded from the fixing portion is between 1 mm and 10 mm.

13. The heat dissipating device of claim 1, wherein the heat dissipating fin further comprises a recess structure formed on the fixing portion.

14. The heat dissipating device of claim 13, wherein the heat dissipating fin further comprises a hook structure formed in the recess structure.

15. The heat dissipating device of claim 1, wherein the heat dissipating fin further comprises a protruding structure protruded from one end of the fixing portion.

16. The heat dissipating device of claim 1, wherein the heat dissipating fin further comprises an extending structure extended from the first overflow-proof structure toward the fixing portion.

17. The heat dissipating device of claim 16, wherein the first overflow-proof structure and the extending structure are formed as U-shape.

* * * * *